United States Patent
Sherwood et al.

(10) Patent No.: US 9,379,688 B2
(45) Date of Patent: Jun. 28, 2016

(54) AIRCRAFT RADIO WITH IMPROVED STANDBY PERFORMANCE

(71) Applicant: Garmin International, Inc., Olathe, KS (US)

(72) Inventors: Charles Gregory Sherwood, Olathe, KS (US); Michael D. Davis, Paola, KS (US); Anthony T. Green, Overland Park, KS (US)

(73) Assignee: Garmin International, Inc., Olathe, KS (US)

( * ) Notice: Subject to any disclaimer, the term of this patent is extended or adjusted under 35 U.S.C. 154(b) by 0 days.

(21) Appl. No.: 14/246,931

(22) Filed: Apr. 7, 2014

(65) Prior Publication Data

US 2014/0220918 A1    Aug. 7, 2014

Related U.S. Application Data

(60) Provisional application No. 61/811,277, filed on Apr. 12, 2013.

(51) Int. Cl.
*H04B 1/18*    (2006.01)
*H03J 1/00*    (2006.01)

(52) U.S. Cl.
CPC .................................. *H03J 1/0083* (2013.01)

(58) Field of Classification Search
CPC .... H04B 7/18506; H03J 1/0083; H03J 7/023; H03J 7/183
USPC ................ 455/132–136, 161.1–161.3, 150.1, 455/152.1, 179.1, 181.1, 187.1
See application file for complete search history.

(56) References Cited

U.S. PATENT DOCUMENTS

| | | | | |
|---|---|---|---|---|
| 5,121,259 A * | 6/1992 | Yamashita | ................... | 386/314 |
| 5,563,952 A * | 10/1996 | Mercer | ................... | 381/56 |
| 5,784,476 A * | 7/1998 | Bird | ................... | 381/107 |
| 6,148,008 A * | 11/2000 | Okamoto | ................... | 370/486 |
| 6,628,930 B1 * | 9/2003 | Vogt et al. | ................... | 455/131 |
| 7,937,055 B2 * | 5/2011 | Schroeder et al. | ................... | 455/191.1 |
| 2002/0115418 A1 * | 8/2002 | Wildhagen | ................... | 455/133 |
| 2004/0081324 A1 * | 4/2004 | Lau et al. | ................... | 381/106 |
| 2005/0191979 A1 * | 9/2005 | Spellman | ................... | 455/178.1 |
| 2005/0277393 A1 * | 12/2005 | Seo | ................... | 455/130 |
| 2007/0216807 A1 * | 9/2007 | Otsuka et al. | ................... | 348/565 |
| 2007/0224962 A1 * | 9/2007 | Bator et al. | ................... | 455/272 |

(Continued)

OTHER PUBLICATIONS

Garmin's SL40™ VHF Comm Pilot's Guide, p. 5, printed Sep. 2011.

(Continued)

*Primary Examiner* — Simon Nguyen
(74) *Attorney, Agent, or Firm* — Samuel M. Korte; Max M. Ali

(57) ABSTRACT

An aircraft radio comprises a receiver, an audio output, and a processing element. The receiver is tuned to a first radio frequency which provides a first audio signal and a second radio frequency which provides a second audio signal. The audio output provides an audio signal to a listening device. The processing element is coupled to a memory element and is configured to tune the receiver to the first radio frequency for a first time period, present the first audio signal to the audio output during the first time period, tune the receiver to the second radio frequency for a second time period to detect presence of the second audio signal, and present audio derived from the first audio signal to the audio output during at least a portion of the second time period.

23 Claims, 2 Drawing Sheets

(56) References Cited

U.S. PATENT DOCUMENTS

| | | | |
|---|---|---|---|
| 2008/0117332 A1* | 5/2008 | Katayama | 348/568 |
| 2008/0219480 A1* | 9/2008 | Hopkins | 381/123 |
| 2008/0268802 A1* | 10/2008 | Ricard et al. | 455/179.1 |
| 2008/0318518 A1* | 12/2008 | Coutinho et al. | 455/3.06 |
| 2010/0100923 A1* | 4/2010 | Toiyama | 725/131 |
| 2010/0162295 A1* | 6/2010 | Shin et al. | 725/30 |
| 2011/0029109 A1* | 2/2011 | Thomsen et al. | 700/94 |
| 2011/0205443 A1* | 8/2011 | Kawai et al. | 348/706 |
| 2011/0208388 A1* | 8/2011 | Yang et al. | 701/36 |
| 2013/0129117 A1* | 5/2013 | Thomsen et al. | 381/111 |

OTHER PUBLICATIONS

Garmin's GNC 255A/255B Pilot's Guide, printed Nov. 2012.
Printout from http://www.vansairforce.com/community/showthread.php?t=13648, printed prior to Apr. 7, 2014.

* cited by examiner

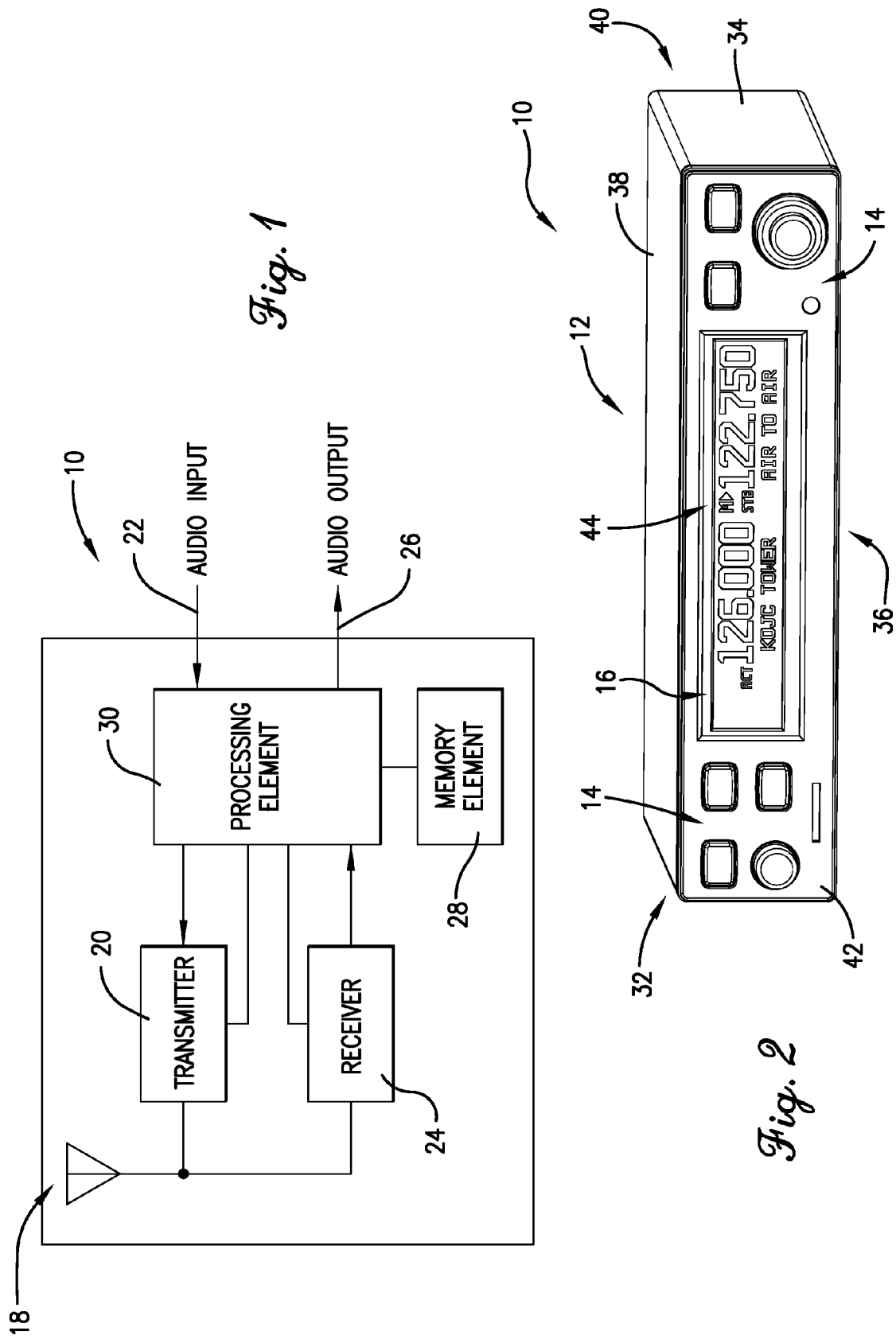

AIRCRAFT RADIO WITH IMPROVED STANDBY PERFORMANCE

CROSS-REFERENCE TO RELATED APPLICATIONS

The present application claims the benefit under 35 U.S.C. §119(e) of U.S. Provisional Application Ser. No. 61/811,277, entitled AIRCRAFT RADIO WITH IMPROVED STANDBY PERFORMANCE, filed on Apr. 12, 2013. U.S. Provisional Application Ser. No. 61/811,277 is herein incorporated by reference in its entirety.

BACKGROUND

Aircraft often include a radio that allows a pilot to receive broadcasts relating to weather reports, emergency alerts, or other information and communicate with an air traffic control tower or other aircraft. The radio may be configured to monitor a main, active frequency which may be tuned to receive audio from the air traffic control tower. Because the communications on the active frequency are commonly intermittent with quiet times between communications, the radio may be tuned to a standby frequency and monitor an active frequency for an audio signal. In operation, the radio may output audio signals received on the standby frequency, but may switch to the active frequency when there is communication. Thus, the pilot or co-pilot can hear important audio signals communicated on an active frequency by using a listening device, but can listen to the audio signals provided on one or more standby frequencies when audio signals are not communicated on the active frequency.

SUMMARY

Conventional aircraft radios may periodically tune from a first frequency to a second frequency several times per second to detect whether there is an audio signal provided on either frequency. During the time period over which the conventional radios are tuned to a second frequency, the radio and an associated listening device output either silence (a muted time period) or the audio signal provided on the second frequency during the period of time the conventional radios are tuned to the second frequency. These repeated silent gaps or audio bursts are very noticeable and distract the pilot or co-pilot from concentrating on an audio signal. In many instances, the periodic tuning performed by the conventional radios occurs several times per second and produces audible "pop" sounds each time resulting in a poor quality of audio output by the aircraft radio.

Embodiments of the present technology provide an aircraft radio that at least partially alleviates this problem. An embodiment of the aircraft radio broadly comprises a receiver, an audio output, and a processing element. The receiver is tuned to a first radio frequency, which provides a first audio signal, and a second radio frequency, which provides a second audio signal. The audio output provides an audio signal to a listening device. The processing element is coupled to a memory element and is configured to tune the receiver to the first radio frequency for a first time period, present the first audio signal to the audio output during the first time period, tune the receiver to the second radio frequency for a second time period to detect presence of the second audio signal, and present audio derived from the first audio signal to the audio output during at least a portion of the second time period.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology is described in detail below with reference to the attached drawing figures, wherein:

FIG. 1 is a schematic block diagram of components of an aircraft radio constructed in accordance with various embodiments of the current technology;

FIG. 2 is a perspective view of the aircraft radio of FIG. 1, depicting a housing, a user interface, and a display;

Figure 6:
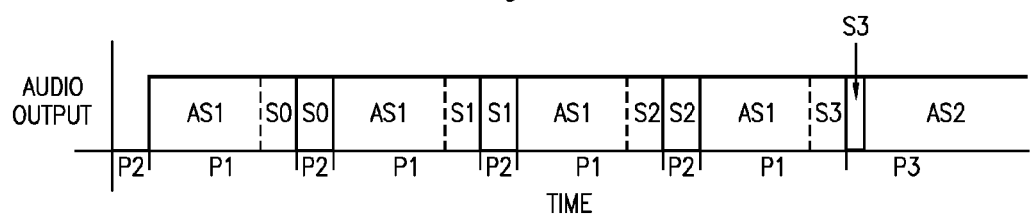
Figure 7:
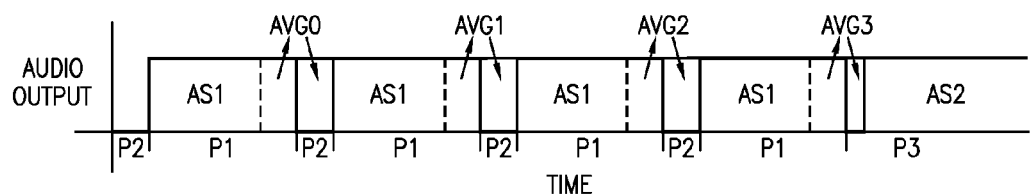

FIG. 6 is a plot of an audio output versus time for the aircraft radio of FIG. 1, depicting an audio sample of a first audio signal being presented when the aircraft radio tunes from the first radio frequency to the second radio frequency; and FIG. 7 is a plot of the audio output versus time for the aircraft radio of FIG. 1, depicting a weighted average of the audio sample of the first audio signal being presented when the aircraft radio is tuned from the first radio frequency to the second radio frequency.

The drawing figures do not limit the present technology to the specific embodiments disclosed and described herein. The drawings are not necessarily to scale, emphasis instead being placed upon clearly illustrating the principles of the technology.

DETAILED DESCRIPTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present technology relate to an aircraft radio having a processing element and a receiver that enable a user to monitor and listen to audio communications on two or more frequencies. Before and during a flight, there may be prioritized communication that the aircraft personnel, such as a pilot, need to hear using a listening device (e.g., instructions provided by an air traffic control tower). The radio may include a receiver that can be tuned to a radio frequency to receive prioritized communications. Typically, the pilot listens to communications and broadcasts received by the radio and output through a headset that is connected to an audio output of the radio. In order to enable the pilot to listen to audio signals provided on a plurality of frequencies while operating the aircraft, the radio may be tuned between two or more radio frequencies. For example, the pilot may desire to listen to helpful information, such as weather reports, emergency alerts, or the like, on a second frequency when there is no activity on frequencies associated with higher-priority communications, such as messages from an air traffic controller.

Embodiments of the present invention may enable a pilot to input two or more frequencies of interest and listen to an audio signal provided on one frequency until the radio receives audio signals on a second frequency using a radio having a single receiver. For instance, a pilot may desire to receive audio signals provided on an active frequency and a standby frequency. In embodiments, the user may transmit audio signals on the active frequency. The radio may give priority to the active frequency over one or more standby frequencies to ensure that important communications intended to be heard by the pilot on the active frequency are output as an audio signal. The radio may output the audio signals that are provided on the active frequency on one or more audio outputs coupled with a listening device (e.g., headset, speaker, etc.) that is used by the pilot. The receiver may be tuned to a standby frequency for a first time period to provide the audio signal on the standby frequency during the first time period and tuned to an active frequency for a second time period to detect the presence of an audio signal.

In embodiments, the radio may output audio derived from the audio signal on the standby frequency during the time period over which the radio is tuned to the active frequency. The receiver may not output the audio signal on the active frequency until after the audio signal is detected. The radio may prioritize audio received on the active frequency by outputting the audio on a listening device shortly after the radio identifies an audio signal on the active frequency. When the audio communication on the active frequency is complete, the radio may tune its receiver back to the standby frequency so the pilot can continue to listen to available audio signals, which may be of a lower-priority than the communications received on the active frequency. The radio may delay tuning a receiver back to the standby frequency for a short period of time if there is additional audio communication on the active frequency. When audio communication is detected on the active frequency the radio may stay on the active frequency indefinitely or until commanded to resume the standby monitor function.

In at least one possible implementation, the radio may include two receivers so that a first receiver can be tuned to the active frequency and a second receiver can be simultaneously tuned to the standby frequency. In such an implementation, the radio would receive the audio from the active frequency and the standby frequency at the same time and could simply switch an audio output from the audio associated with the standby frequency to the audio associated with the active frequency whenever there is audio on the higher-priority active frequency, such as communications from an air traffic control tower. In embodiments, two radios having a receiver may be coupled to an audio panel to provide similar functionality. The drawback to such an implementation is that the additional receiver requires space within a radio's housing and can add significantly to their cost and reliability. Thus, aircraft radios typically include only one receiver that is tuned to two or more frequency of interest to a pilot.

Embodiments of the technology will now be described in more detail with reference to the drawing figures. Referring initially to FIGS. 1 and 2, an aircraft radio 10 is illustrated. The radio 10 may tune to a first radio frequency and then to a second radio frequency periodically to check whether an audio signal is present on the second radio frequency. As described above, the period of time during which the receiver is tuned to a first radio frequency may be constant in embodiments. In other embodiments, the period of time during which the receiver is tuned to the first radio frequency may vary. Audio is provided on an audio output while the receiver is tuned to the second radio frequency for both techniques. The radio 10 may broadly comprise a housing 12, a user interface 14, a display 16, an antenna 18, a transmitter 20, an audio input 22, a receiver 24, an audio output 26, a memory element 28 and a processing element 30.

The housing 12 may include a left sidewall 32, a right sidewall 34, a lower wall 36, an upper wall 38, a rear wall 40, and a face plate 42. The radio 10 is generally installed in a console or instrument panel in an aircraft cockpit or flight deck. Thus, the housing 12 may have a form factor to allow the radio 10 to be positioned in a panel with other equipment. The rear wall 40 may include ports and connectors for signal cabling and electric power supply. The face plate 42 is generally viewed and accessed by the pilot.

The user interface 14 may be positioned on the face plate 42 and generally allows the pilot to utilize inputs and outputs to interact with the radio 10. Inputs may include buttons, pushbuttons, knobs, jog dials, shuttle dials, switches, or the like, or combinations thereof. Outputs may include lights, dials, meters, and the like. The pilot may use the user interface 14 to select various radio frequencies for the active frequency and the standby frequency, select menu items, adjust the volume, or the like. In embodiments, radio 10 may not have a face plate 42 and associated user controls if it is remotely mounted within an aircraft. In such a case, radio 10 is controlled remotely by an interface that duplicates the function and/or controls of the user interface 14 and face plate 42.

The display 16 may include video screens of the following types: plasma, light-emitting diode (LED), organic LED (OLED), Light Emitting Polymer (LEP) or Polymer LED (PLED), liquid crystal display (LCD), thin film transistor (TFT) LCD, LED side-lit or back-lit LCD, or the like, or combinations thereof. The display 16 may be positioned on the face plate 42 and generally possesses a rectangular aspect ratio. In some embodiments, the display 16 may also include a touch screen occupying the entire display 16 or a portion thereof so that the display 16 functions as part of the user interface 14. The touch screen may allow the user to interact with the radio 10 by physically touching, swiping, or gesturing on areas of the display 16. The display 16 may further include an indicator 44 that identifies when at least one of the amplitude levels of the audio signal from the active frequency or the standby frequency is above a threshold. The display 16 may include other indicators identifying the radio frequencies for the active frequency and the standby frequency as well as names or labels for the frequencys.

The antenna 18 may include a patch antenna, a linear antenna, a dipole antenna, or the like, or combinations thereof, and may be directional or omnidirectional. The antenna 18 may be located within the housing 12 or external to the housing 12 and connected to the radio 10 through cables or wires. The antenna 18 generally converts an electronic signal into radio frequency electromagnetic radiation for wirelessly transmitting the signal. The antenna 18 also receives radio frequency electromagnetic radiation and converts it into a received electronic signal. A "radio frequency" may be any center frequency or channel of radio waves that may carry audio signals wirelessly. The radio 10 may include a single antenna 18 that is utilized by the transmitter 20 and the receiver 24. Alternatively, the radio 10 may include additional antennas (not shown) such as a first antenna 18A for use with the transmitter 20 and a second antenna 18B for use with the receiver 24.

The transmitter 20 may include amplifiers, filters, mixers, oscillators, preselectors, synthesizers, signal integrators, or similar wireless transmission components, or combinations thereof. These components may perform intermediate frequency (IF) processing and radio frequency (RF) processing. The transmitter 20 receive an audio transmit signal either from the audio input 22 or from the processing element 30. The transmitter 20 may encode and/or modulate the audio transmit signal into an electronic signal which is communicated to the antenna 18. Furthermore, the transmitter 20 may be selectively tuned, as determined by the processing element 30, to produce the electronic signal a certain radio frequency. The radio frequency may be selected from an exemplary range of 118.000 megahertz (MHz) to 136.975 MHz, which is the aviation voice band. Furthermore, one or more of the components of the transmitter 20 may have settings for parameters such as amplifier gain or the like that can be selected or programmed. The parameters may be provided by the processing element 30. The transmitter 20 may be utilized when the pilot wants to communicate with the air traffic control tower, other aircraft or other entities capable of receiving the audio signals transmitted by transmitter 20 and antenna 18.

The audio input 22 may be a port which receives the audio transmit signal from an external source, such as a microphone included with the pilot's headset. The audio input 22 may communicate the audio transmit signal to the processing element 30 or the transmitter 20.

The receiver 24 may include amplifiers, filters, mixers, oscillators, preselectors, synthesizers, signal integrators, or similar wireless transmission components, or combinations thereof. These components may perform IF processing and RF processing. The receiver 24 may be selectively tuned to receive a radio frequency electronic signal from the antenna 18. In embodiments, the radio frequency may be the frequency for either the standby frequency, associated with the first radio frequency f1, or the active frequency, associated with the second radio frequency f2, and may be selected from the aviation voice band, as mentioned above. The tuning of the receiver 24 may be selected and/or adjusted by a signal or data from the processing element 30. Furthermore, one or more of the components of the receiver 24 may have settings for parameters such as amplifier gain or the like that can be selected or programmed. The parameters may be provided by the processing element 30. The receiver 24 may decode and/or demodulate the radio frequency electronic signal to produce a receive audio signal that is presented to the processing element 30. The receive audio signal may be the first audio signal AS1 if the receiver 24 is tuned to the first radio frequency f1 or it may be the second audio signal AS2 if the receiver 24 is tuned to the second radio frequency f2.

The audio output 26 may be a port which outputs an audio signal to an external listening device, such as the pilot's headset, audio speakers, or both. The external listening device may be coupled with the audio output 26 through wires that are connected to a speaker or through wireless communication. The audio output 26 may receive processed audio signal from the processing element 30.

The memory element 28 may include data storage components such as read-only memory (ROM), programmable ROM, erasable programmable ROM, random-access memory (RAM) such as static RAM (SRAM) or dynamic RAM (DRAM), hard disks, floppy disks, optical disks, flash memory, thumb drives, universal serial bus (USB) drives, or the like, or combinations thereof. The memory element 28 may include, or may constitute, a "computer-readable medium". The memory element 28 may store the instructions, code, code segments, software, firmware, programs, applications, apps, services, daemons, or the like that are executed by the processing element 30. The memory element 28 may also store settings, data, sampled audio, processed sampled audio, or the like, or combinations thereof. In addition, the memory element 28 may store a plurality of radio frequency values, each one corresponding to a radio frequency that can provide an audio signal.

The processing element 30 may include processors, microprocessors, microcontrollers, digital signal processors (DSPs), field-programmable gate arrays (FPGAs), analog and/or digital application-specific integrated circuits (ASICs), or the like, or combinations thereof. The processing element 30 may further include electronic components such as amplifiers, filters, analog to digital converters (ADCs), digital to analog converters (DACs), or the like, or combinations thereof. The processing element 30 may generally execute, process, or run instructions, code, code segments, software, firmware, programs, applications, apps, processes, services, daemons, or the like, or may step through states of a finite-state machine. The processing element 30 may be in communication with the other components of the radio 10 through serial or parallel links that include address busses, data busses, control lines, and the like. The processing element 30 may have bi-directional links with the transmitter 20 and the receiver 24 through which signals, data, or both are communicated.

The processing element 30 may be configured to provide a signal or a radio frequency value to tune the receiver 24 and transmitter 20 to the appropriate frequency to receiver and transmit audio communication between the pilot and the air traffic control tower or other aircraft. The processing element 30 may also provide settings to the transmitter 20 to control amplifier gain or other performance parameters.

The processing element 30 may be further configured to provide control of the frequency monitoring and output functionality. The receiver 24 may be tuned from a first radio frequency to a second radio frequency a certain number of times per second to detect the presence of the second radio signal. For example, the processing element 30 may tune receiver 24 from the standby frequency to the active frequency five times per second. In embodiments, the processing element 30 may control receiver 24 to tune to a first frequency for a first period of time and tune receiver 24 to a second frequency to determine whether an audio signal is present on the second frequency. Processing element 30 may output to audio output 26 an audio signal associated with the first frequency during the first period of time and audio derived from the audio signal associated with the first frequency during the second period of time which the receiver 24 is tuned to the second frequency.

Figure 4:
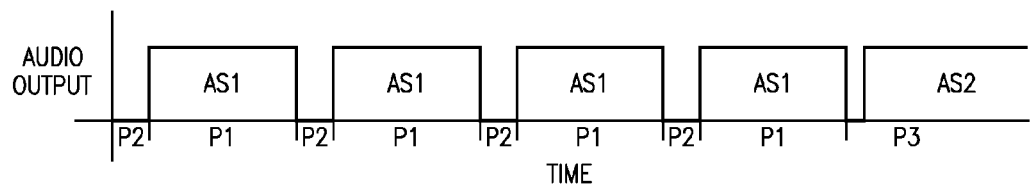
FIG. 4 is a plot of an audio output versus time for a prior art aircraft radio, depicting a silent gap that occurs when the aircraft radio tunes from the first radio frequency to the second radio frequency.

The use of a single antenna 24 to monitor and listen to audio communications provided on two or more frequencies presents challenges, some of which are overcome by embodiments of the present invention. As described above, conventional radios output a short burst of silence or audio associated with the second radio frequency f2 every time the conventional radio is tuned to the second radio frequency f2. Because conventional radios commonly tune to the second radio frequency f2 several times per second, the silence or second audio signal AS2 associated with the alternate frequency is output to a pilot's headset over the second time period P2, which may be 10 ms, thereby producing a distracting "pop" sounds each time the receiver of conventional radios is re-tuned. As shown in FIG. 4, conventional radios may mute the audio output to reduce noise, static, or pops during the time period its receiver is tuned to the second frequency to determine whether a second audio signal AS2 is present on the alternate frequency. The second time period P2 associated with the muted audio output for the conventional radios is depicted by the audio output having no magnitude. Thus, there is a silent gap or burst of the second audio signal AS2 at the audio output of the conventional radio during each period of time that the receiver is tuned to the active frequency and the second audio signal is not present. The pilot hears these silent gaps or audio bursts as regular, repeated breaks in the sound of the weather report or other information to which he is listening on the standby frequency. The silent gaps or audio bursts and the constant frequency at which they occur can distract the pilot and/or lead to listening fatigue.

Embodiments of the present invention overcome this effect by outputting to audio output 26 the first audio signal AS1 or audio derived from the first audio signal AS1 during at least a portion of the time period during which the receiver 24 is tuned to the second radio frequency f2. Processing element 30 continues to provide recognizable audio to reduce the distraction caused by repeatedly tuning receiver 24 to other frequencies with little time passing between each time receiver 24 is tuned to the second radio frequency f2. Specifically, as detailed below, processing element 30 may be configured to provide a portion of the first audio signal AS1 or audio derived from the first audio signal AS1 through the audio output 26 while the receiver 24 is tuned to the first radio frequency f1 during first time period P1 and then continue to provide first audio signal AS1 or audio derived from first audio signal AS1 while the receiver is tuned to the second radio frequency f2 during the second time period P2. Audio is provided on an audio output 26 while receiver 24 is tuned to the second radio frequency f2 provided that the radio 10 received a first audio signal AS1 on the first radio frequency f1 during at least a portion of the first time period P1. If the radio 10 either did not receive or received a low level of a first audio signal AS1 on the first radio frequency f1 shortly before or when receiver 24 is tuned to the second radio frequency f2, continued silence or a low level of audio is provided on the audio output 26 to make the second time period P2 during which receiver 24 is tuned to a second radio frequency f2 less-intrusive and indiscernible to the pilot.

The processing element 30 may tune the receiver 24 to the first radio frequency f1 for a first time period P1. The processing element 30 may tune the receiver 24 to the second radio frequency f2 for a second time period P2. Generally, the second time period P2, during which the processing element 30 checks for the presence of the second audio signal AS2, is of constant length because a certain minimum time is required to set up the receiver 24 components and begin the process of validating the presence of the second audio signal AS2 provided on the second radio frequency f2. The processing element 30 may control receiver 24 to remained tune to (i.e., locked to) the second radio frequency f2 until the communication of the second audio signal AS2 is complete if the processing element 30 detects the presence of a second audio signal AS2 during the third time period P3.

Figure 3:
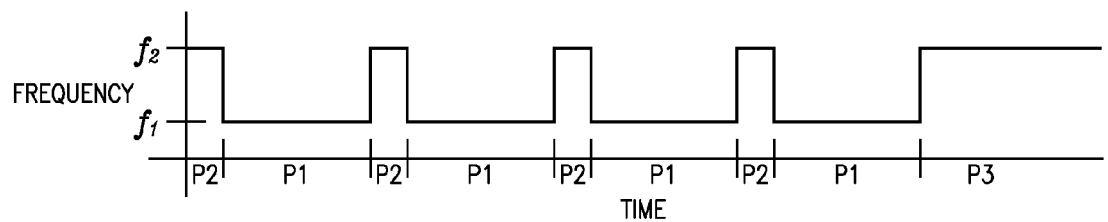
FIG. 3 is a plot of a frequency versus time for the aircraft radio of FIG. 1, depicting a switching process between a first radio frequency and a second radio frequency with a constant period of time occurring in between switching.

As shown in FIG. 3, the receiver 24 may be tuned to the first radio frequency f1 for a first time period P1 and the second radio frequency f2 for a second time period P2. The receiver may remained tuned (i.e., locked to) the second radio frequency f2 for a third time period P3. In embodiments, the first time period P1 is constant and much greater in length than the second time period P2. The third time period P3 may be any length of time that receiver 24 may remain tuned to the second radio frequency f2 to enable processing element 30 to output the second audio signal AS2 to the audio output 26 until the communication is complete. In embodiments, receiver 24 may stay tuned to the second radio frequency f2 for third time period P3 that includes a short period of time, such as one or two seconds, at the end of the third time period P3 before receiver 24 is tuned to the first radio frequency f1 in order to ensure that the communication of the second audio signal AS2 is complete.

Figure 5:
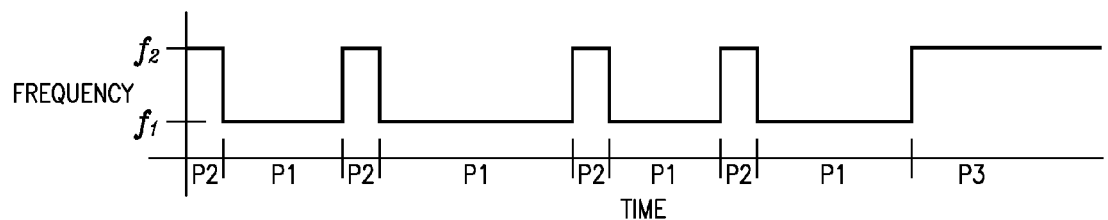
FIG. 5 is a plot of a frequency versus time for the aircraft radio of FIG. 1, depicting a switching process between a first radio frequency and a second radio frequency with a variable period of time occurring in between switching.

As an example, the first time period P1 may be constant and have a length of approximately 190 milliseconds (ms), while the second time period P2 may be 10 ms. As illustrated in FIG. 5 and detailed below, the length of the first time period P1 may vary in embodiments of the present invention. A first audio signal AS1, providing information such as weather reports, may be provided on the first radio frequency f1. A second audio signal AS2, providing air traffic control tower communication, may be provided on the second radio frequency f2 during the third time period P3. The first audio signal AS1 and the second audio signal AS2 may be provided through the audio output 26 to the pilot's listening device, such as a headset. At regular intervals, the receiver 24 is tuned to an active radio frequency f2 to determine whether audio signal AS2 is present. If processing element 30 determines that the second audio signal AS2 is present while receiver 24 is tuned to the second radio frequency f2 (indicating incoming communication from the air traffic control tower, other aircraft, or other entities capable of transmitting on second frequency f2), then the receiver 24 may remain tuned to the second radio frequency f2 and the second audio signal AS2 is provided to the audio output 26 until the communication is complete during the third time period P3. If processing element 30 determines that the audio signal AS2 is not present while receiver 24 is tuned to the second radio frequency f2, then processing element 30 repeats the above-described process by tuning the receiver 24 to the first radio frequency f1 and the first audio signal AS1 is provided to the audio output 26 and the radio 10 continues monitoring the second radio frequency f2 at regular intervals.

In embodiments, the processing element 30 may continue to check the amplitude level of the second audio signal AS2 during the third time period P3 before tuning the receiver 24 back to the first audio frequency f1. If the amplitude level of the second audio signal AS2 drops below a threshold level for longer than a predetermined length of time, then the processing element 30 may tune the receiver 24 back to the first audio frequency f1 and resume the cycle of periodically tuning between the first radio frequency f1 and the second radio frequency f2 by presenting the first audio signal AS1 to the audio output 26. The predetermined length of time should be sufficient to allow participants in the communication of the second audio signal AS2 to pause between words or exchange audio communications in order to avoid prematurely tuning receiver 24 back to the first audio frequency f1 during a conversation on the second audio frequency f2. For example, the predetermined length of time processing device 30 may delay tuning receiver 24 back to the first audio frequency f1 at the end of third time period P3 may be approximately one second.

FIG. 3 further illustrates that, in an exemplary situation, the second audio signal AS2 is not present on the second radio frequency f2 the first four times when receiver 24 is tuned to the second radio frequency f2, but is present on the fifth time receiver 24 is tuned to the second radio frequency f2 during the third time period P3. In embodiments, processing element 30 is configured to control receiver 24 to remain tuned to the second radio frequency f2 and output the second audio signal AS2 on audio output 26 in order to provide the pilot with the second audio signal AS2 that is present on the second radio frequency f2, which may be an active frequency commonly associated with higher-priority communications (e.g., instructions from an air traffic controller, conversations with other aircraft, etc.), during the third time period P3.

In embodiments, if processing device 30 cannot complete the process for detecting the presence of the second audio signal AS2 during the length of the second time period P2, processing device 30 may tune receiver 24 from the first radio frequency signal f1 to the second radio frequency f2 immediately or shortly after completing the process of detecting the presence of the first audio signal AS1. Thus, if processing element 30 has tuned receiver 24 back to the first radio frequency signal f1 before processing element 30 completes the process for detecting whether the second audio signal AS2 is present on the second radio frequency f2 during the second time period P2, processing element 30 may immediately tune receiver 24 back to the second radio frequency f2 immediately after completing the process for detecting the presence of the second audio signal AS2 on the second radio frequency f2 before first time period P1 is completed or wait until receiver 24 is tuned back to the second radio frequency f2 upon the completion of the first time period P1 to provide the second audio signal AS2 during the third time period P3.

As shown in FIG. 5, processing element 30 may vary, or dither, the first time period P1. Compared with the constant value of the first time period P1 in FIG. 3, the value of the first time period P1 in FIG. 5 is greater at some times and lesser at other times. In embodiments, the varying lengths of the first time period P1 may average approximately 190 milliseconds (ms). The processing element 30 may vary the first time period P1 using a plurality of techniques. Generally, the processing element 30 may determine the length of first time period P1 based on a random selection or according to a predetermined pattern. In some embodiments, processing element 30 may select a value from a predetermined pattern of values within a time window range of values for the first time period P1 having a median value plus or minus a window value. As an example, the median value may be approximately 190 ms, while the window value may be approximately 50 ms—yielding a range of lengths for the first time period P1 to be approximately 140 ms to approximately 240 ms. The overall effect of varying the value within a range of values may be that the time period P1 has an average value equal to the median value. In other embodiments, processing element 30 may select a random value for the first time period P1, such as any value from the time window range of values. In yet other embodiments, the processing element 30 may adjust or determine a value for the first time period P1 based on an amplitude level of the first audio signal AS1. For example, it may be advantageous to tune the receiver 24 from the first radio frequency f1 for a first time period P1 to the second radio frequency f2 for a second time period P2 while there is audible sound, such as speech, on the first radio frequency f1 so that the tuning to the second radio frequency f2 is not as noticeable to the pilot. Alternatively, it may be advantageous to tune the receiver 24 from the first radio frequency f1 for a first time period P1 to the second radio frequency f2 for a second time period P2 while there is reduced audible sound, such as silence or a low level of audio, on the first radio frequency f1 so that the tuning to the second radio frequency f2 is not as noticeable to the pilot. Thus, the processing element 30 may determine the amplitude level of the first audio signal AS1 and utilize the amplitude level to determine when to tune the receiver 24 to the second radio frequency f2. For example, if the amplitude level of the first audio signal AS1 rises above or drops below a threshold level during the first time period P1, then the processing element 30 may tune the receiver 24 from the first radio frequency f1 to the second radio frequency f2 for a second time period P2. If the amplitude level of the first audio signal AS1 has not crossed the threshold within a predetermined maximum delay, such as the end of the time window range of values for the first time period P1, then the processing element 30 may tune the receiver 24 from the first radio frequency f1 to the second radio frequency f2 for a second time period P2 at the end of a predetermined maximum delay or an available time window range of values.

As described above, the processing element 30 may provide audio to the audio output 26 during the second time period P2 while the receiver 24 is tuned to the second radio frequency f2 to reduce distractions and listening fatigue for the user. The audio provided may be a portion of the first audio signal AS1 or audio derived from the first audio signal AS1. In some embodiments, the processing element 30 may sample the first audio signal AS1 during the first time period P1. The memory element 28 may include a buffer that stores a sample of audio recorded (i.e., stored) from the first audio signal AS1 while receiver 24 is tuned to the first radio frequency f1. The length of time of the recorded audio sample may be equal to the second time period P2, so that the sampled audio may be provided to the audio output 26 and a listening device coupled thereto during the second time period P2. For example, the audio sample stored in the buffer of memory element 28 may be the final portion of the first audio signal AS1 that is recorded in memory element 28 before the end of the first time period P1. In embodiments, the length of time of the recorded audio sample may not be equal to the second time period P2, so the sample audio stored in the buffer of memory element 28 may need to be compressed (if the length of the sample is longer than the second time period P2) or expanded (if the length of the sample is shorter than the second time period P2) by processing element 30 before the sampled audio is provided to the audio output 26 and a listening device coupled thereto during the second time period P2.

The process of providing audio to the audio output 26 during the second time period P2 is illustrated in the plot of FIG. 6, which depicts the audio provided to the audio output 26 over time. During all of the first time periods P1, the first audio signal AS1 is provided unaltered to the audio output 26. During the initial second time period P2, there is no audio at the audio output 26 because no audio sample was previously recorded in memory element 28. During the next three second time periods P2, audio samples S0-S2 are recorded at the end of each first time period P1 and provided to the audio output 26 to reduce distractions and listening fatigue for the user. During the third time period P3, the presence of second audio signal AS2 is detected by processing element 30 and subsequently presented to audio output 26 until the communication of the second audio signal AS2 is completed. A portion of audio sample S3 may be provided to the audio output 26 during the third time period P3 until processing element 30 detects the presence of second audio signal AS2 on the second radio frequency f2 and outputs the second audio signal AS2 to audio output 26. For example, processing element 30 may stop outputting sample S3 to audio output 26 and begin outputting the second audio signal AS2 to audio output 26 immediately upon detecting the presence of audio signal AS2 on the second radio frequency f2 and control receiver 24 to remain tuned to (i.e. lock onto) the second audio frequency f2 until the communication of audio signal AS2 is complete during the third time period P3. The entirety of sample S3 would be provided to audio output 26 if the presence of second audio signal AS2 could not be detected during second time period P2.

In some embodiments, the processing element 30 may apply a windowed weighted averaging of two or more audio samples of the first audio signal AS1. The weighted average of the audio samples of the first audio signal AS1 may be stored in memory element 28 and provided to the audio output 26 during the second time period P2. Summing a weighted average of a plurality of audio samples may have the benefit of deemphasizing any peaks or lulls in the amplitude of the audio that may occur in the first audio signal AS1 when the samples are stored in memory element 28 during the first time period P1. This process is illustrated in the plot of FIG. 7, which depicts the audio provided to the audio output 26 over time in a similar fashion to that of FIG. 6. During all of the first time periods P1, the first audio signal AS1 is provided unaltered to the audio output 26. During the initial second time period P2, there is no audio at the audio output 26 because no audio samples were previously recorded in memory element 28. During the next three second time periods P2, the weighted average AVG0-AVG2 of samples stored in memory element 28 at the end of each first time period P1 is provided to the audio output 26. During the third time period P3, a portion of the weighted average AVG3 may be provided to the audio output 26 before the presence of second audio signal AS2 is detected by processing element 30 and subsequently presented to the audio output 26. The entirety of weighted average AVG3 would be provided to audio output 26 if the presence of second audio signal AS2 could not be detected during second time period P2.

In embodiments, when processing element 30 transitions between outputting audio signal AS1 and the audio derived from the first audio signal AS1 on audio output 26 during the second time period P2, the processing element 30 may gradually decrease the amplitude of the first audio signal AS1 from a first audio level to a second audio level while increasing the amplitude of the audio derived from the first audio signal AS1 from a second audio level to a first audio level to make the transition from audio signal AS1 and the derived audio signal less noticeable to the pilot. For example, the amplitude of the first audio signal AS1 may be reduced by 30% when the amplitude of the audio derived from the first audio signal AS1 may be increased by 30%. When the processing element 30 transitions back to output the first audio signal AS1 during the first time period P1 from outputting the audio derived from the first audio signal AS1 on audio output 26, the amplitude of the first audio signal AS1 may be gradually increased while the amplitude of the derived audio signal may be decreased to make the transition back to output of the first audio signal AS1 less noticeable to the pilot. The first audio level may be the amplitude of the first audio signal AS1 during the first time period P1 and the second audio level may be a muted level or substantially below the first audio level.

In embodiments, the processing element 30 may evaluate the amplitude level of any received signal on the second radio frequency f2 to determine whether it crosses a threshold level in order to detect the presence of the second audio signal AS2. If the amplitude level of the second audio signal AS2 is below a threshold (indicating no communication from the air traffic control tower on the active frequency, for example), then the processing element 30 may tune the receiver 24 back to the first audio frequency f1 and resume the cycle of periodically tuning between the first radio frequency f1 and the second radio frequency f2. The processing element 30 may present the first audio signal AS1 unaltered to the audio output 26. The processing element 30 may retrieve the component settings associated with receiver 24 from the memory element 28 and may set the components of receiver 24 to those values. If the amplitude level of the second audio signal AS2 is above the threshold (indicating communication from the air traffic control tower on the active frequency), then the processing element 30 may control receiver 24 to remain tuned to (i.e. lock onto) the second audio frequency f2 and provide the second audio signal AS2 to audio output 26 until the communication is complete during the third time period P3, as shown in FIGS. 3 and 5-7. The processing element 30 may use a similar process when transitioning from outputting the second audio signal AS2 to the first audio signal AS1.

In embodiments, the processing element 30 may delay tuning and locking receiver 24 to second audio frequency f2 for a third time period P3 until after processing element 30 determines that a communication provided by the first audio signal AS1 is completed. The processing element 30 may delay the switch to the second audio frequency f2 for a maximum predetermined delay period before tuning receiver 24 to the second audio frequency f2 and remaining tuned to (i.e. locked onto) the second audio frequency f2 and provide the second audio signal AS2 to audio output 26 until the communication is complete during a third time period P3. The processing element 30 may be configured to present an indicator graphic on display 16 and/or user interface 14 to notify the user of the detected presence of a first audio signal AS1 on the first audio frequency f1. The indicator graphic may be presented during this delay period or in every instance that receiver 24 remains tuned to (i.e. lock onto) the second audio frequency f2 to provide the second audio signal AS2 in order to aid the pilot.

In embodiments, processing device 30 may monitor a plurality of frequencies to detect the presence of an audio signal on the plurality of frequencies. The monitored frequencies may be stored in memory element 28. For example, fifteen communication frequencies (f1-f15) may be stored in a database and ordered based on a priority associated with each frequency. The frequencies may be added to the database either manually by a user or automatically as the user tunes receiver 24 to various frequencies of interest through the use of user interface 14. As described above, processing element 30 may tune receiver 24 to the first radio frequency f1 during all of the first time periods P1 and sequentially tune receiver 24 to the second radio frequency f2 through the fifteenth radio frequency f15 during each of the second time periods P2. As described above, the audio provided on audio output 26 during the second time periods P2 may be a portion of the first audio signal AS1 or audio derived from the first audio signal AS1. Processing element 30 may control receiver 24 to tune and lock onto any one of the fifteen radio frequencies based on the priority associated with the audio signals that may be provided on each of the stored radio frequencies during a third time period P3. For example, radio 10 may monitor three radio frequencies (f1-f3) by presenting the first audio signal AS1 during the first time period P1 and a portion of the first audio signal AS1 or audio derived from the first audio signal AS1 while processing element 30 sequentially tunes receiver 24 during the second time period P2 to the second radio frequency f2 and the third radio frequency f3 in order to detect the presence of a second audio signal AS2 or a third audio signal AS3 provided on frequencies f2 and f3. Processing element 30 may control receiver 24 to tune and lock onto the third audio signal AS3 during the third time period P3 if the priority associated with the third audio signal AS3 is higher than the priority associated with the first audio signal AS1 and the second audio signal AS2.

The processing element 30 may implement the following steps in tuning the receiver 24 from a first radio frequency f1 for a first time period P1, such as the standby frequency, to a second radio frequency f2 for a second time period P2, such as the active frequency. During all of the first time periods P1, the first audio signal AS1 is provided unaltered to the audio output 26. At the end of the first time period P1, the processing element 30 may record one or more audio samples of the first audio signal AS1 and store the samples in the memory element 28. The processing element 30 may provide a portion of first audio signal AS1 or audio derived from the first audio signal AS1, such as the sample S or the weighted average AVG described above, to the audio output 26 during the second time period P2. The processing element 30 may tune the receiver 24 to the second audio frequency f2, such as by setting synthesizers or preselectors to this frequency, and in order to evaluate the characteristics of any signal received during the second time period P2 to determine whether the second audio signal AS2 is currently being received on the second audio frequency f2. In embodiments, the processing element 30 may evaluate the amplitude level of any received signal to determine whether it crosses a threshold level in order to detect the presence of the second audio signal AS2 on the second radio frequency f2.

The radio 10 may operate as follows. As shown in FIG. 2, the pilot may utilize the user interface 14 to initiate the monitoring functionality and to input the radio frequencies for the active frequency and the standby frequency. A pushbutton of user interface 14 may be depressed to begin monitoring at least a second frequency. In embodiments, the display 16 may present a graphic element near a radio frequency that is being monitored to indicate that the monitoring functionality is active. For example, a graphic element of the text "MN" may be presented next to the radio frequencies for the active frequency and the standby frequency presented on display 16. The radio frequencies may be manually entered as needed or may be selected from frequencies that were previously entered and stored in the memory element 28.

When the pilot wishes to communicate with the air traffic control tower, he may utilize the user interface 14 to initiate the communication or the communication may be triggered externally. The radio 10 may receive the audio from the pilot through the audio input 22 and may transmit it through the transmitter 20. When the pilot is not communicating, the radio 10 may be configured to receive audio from the standby frequency while it periodically checks for communication on the specified active frequency. For example, the pilot may tune the active frequency to receive communications from the air traffic control tower and the standby frequency to receive weather reports. In such a configuration, the radio 10 will receive and output the weather reports, but it will continue to periodically tune receiver 24 to the active frequency to check for communications from the air traffic control tower, which are of higher-priority to the pilot. The radio 10 may check the active frequency at a constant rate, e.g., five times per second or vary the time in between checks (the first time period P1). Generally, the time required to check the active frequency (the second time period P2) remains constant. However, the second time period P2 may be varied to account for signal quality or as specified by the user. The length of the first time period P1 may be random or selected according to a predetermined pattern. In addition, the radio 10 may adjust the length of the first time period P1 based on when the amplitude of the audio from the standby frequency is greater than a given threshold.

While the receiver 24 of radio 10 is tuned from the standby frequency to the active frequency, processing element 30 may provide audio to fill in the gap during the second time period P2 so that the user does not hear short bursts of silence or another audio signal as heard by users of conventional radios. The audio may be a portion of or derived from the audio signal provided on the standby frequency. The audio may be a recorded audio sample of the standby frequency audio stored in memory element 28 prior to the receiver 24 tuning to the active frequency. Furthermore, the audio may be a weighted average of a plurality of audio samples stored in memory element 28. By outputting audio that is a portion of or derived from the standby frequency during the period of time the receiver 24 is tuned to the active frequency, the radio 10 makes the active frequency monitoring process much less intrusive or noticeable to the pilot, thereby reducing distractions and listening fatigue during the second time period P2.

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. An aircraft radio comprising:
   a receiver configured to be tuned to a first radio frequency and a second radio frequency, the first radio frequency providing a first audio signal and the second radio frequency providing a second audio signal;
   a memory element configured to store audio derived from the first audio signal;
   an audio output configured to output an audio signal to a listening device; and
   a processing element coupled to the memory element, the processing element configured to
   tune the receiver to the first radio frequency for a first time period,
   present the first audio signal to the audio output during the first time period,
   tune the receiver to the second radio frequency for a second time period to detect presence of the second audio signal, and
   present audio derived from the first audio signal to the audio output during at least a portion of the second time period when the receiver is tuned to the second radio frequency.

2. The aircraft radio of claim 1, wherein the processing element is further configured to gradually decrease the amplitude of audio signal while increasing the amplitude of the audio derived from the first audio signal.

3. The aircraft radio of claim 1, wherein the processing element selects a length of the first time period according to a predetermined pattern.

4. The aircraft radio of claim 1, wherein the processing element adjusts a length of the first time period based on an amplitude level of the first audio signal.

5. The aircraft radio of claim 4, wherein the processing element tunes the receiver to the second radio frequency when an amplitude level of the first audio signal is above a threshold.

6. The aircraft radio of claim 1, further comprising a display including an indicator graphic configured to indicate that at least one of the first audio signal or the second audio signal is above a threshold.

7. The aircraft radio of claim 1, wherein the audio derived from the first audio signal is an audio sample of the first audio signal during the first time period.

8. An aircraft radio comprising:
a receiver configured to be tuned to a first radio frequency and a second radio frequency, the first radio frequency providing a first audio signal and the second radio frequency providing a second audio signal;
a memory element configured to store a portion of the first audio signal;
an audio output configured to output an audio signal to a listening device; and
a processing element coupled to the memory element, the processing element configured to
tune the receiver to the first radio frequency for a first time period,
present the first audio signal to the audio output during the first time period,
tune the receiver to the second radio frequency and present audio derived from the first audio signal to the audio output during a second time period,
check for the presence of the second audio signal, and
present the second audio signal to the audio output if the second audio signal is present, or
tune the receiver to the first radio frequency and present the first audio signal to the audio output at the end of a second period of time if the second audio signal is not present.

9. The aircraft radio of claim 8, wherein the audio derived from the first audio signal includes a portion of the first audio signal recorded in the memory element during the first time period.

10. The aircraft radio of claim 8, wherein the audio derived from the first audio signal includes a weighted windowed moving average of an amplitude level of a portion of the first audio signal during the first time period.

11. The aircraft radio of claim 8, wherein the processing element presents the second audio signal to the audio output for a predetermined period after an amplitude level of the second audio signal is below a threshold.

12. The aircraft radio of claim 11, wherein the processing element tunes the receiver to the first radio frequency and presents the first audio signal to the audio output at the end of the predetermined period.

13. The aircraft radio of claim 8, wherein a value of a third radio frequency is stored in the memory element and the receiver is further configured to the third radio frequency providing a third audio signal.

14. The aircraft radio of claim 8, wherein the audio derived from the first audio signal is an audio sample of the first audio signal during the first time period.

15. An aircraft radio comprising:
a receiver configured to be tuned to a first radio frequency and a second radio frequency, the first radio frequency providing a first audio signal and the second radio frequency providing a second audio signal;
a memory element configured to record a portion of the first audio signal;
an audio output configured to output an audio signal; and
a processing element coupled to the memory element, the processing element configured to
tune the receiver to the first radio frequency for a first time period,
present the first audio signal to the audio output during the first time period,
record a portion of the first audio signal received during the first time period in the memory element,
tune the receiver to the second radio frequency and present the recorded audio to the audio output during a second time period,
check for the presence of the second audio signal, and
present the second audio signal to the audio output if the second audio signal is present, or
tune the receiver to the first radio frequency and present the first audio signal to the audio output at the end of a second period of time if the second audio signal is not present.

16. The aircraft radio of claim 15, wherein the processing element is further configured to gradually decrease the amplitude of audio signal from a first audio level to a second audio level while increasing the amplitude of the audio derived from the first audio signal from a second audio level to a first audio level.

17. The aircraft radio of claim 15, wherein the processing element selects a length of the first time period according to a predetermined pattern.

18. The aircraft radio of claim 15, wherein the processing element adjusts a length of the first time period based on an amplitude level of the first audio signal.

19. The aircraft radio of claim 15, wherein the recorded audio includes a weighted windowed moving average of an amplitude level of a plurality of samples of audio signal recorded during the first time period.

20. The aircraft radio of claim 15, wherein the processing element presents the second audio signal to the audio output for a predetermined period after an amplitude level of the second audio signal is below a threshold.

21. The aircraft radio of claim 20, wherein the processing element tunes the receiver to the first radio frequency and presents the first audio signal to the audio output at the end of the predetermined period.

22. The aircraft radio of claim 15, wherein the processing element is further configured to tune the receiver to a third radio frequency providing a third audio signal during a second time period and check for the presence of a third audio signal.

23. The aircraft radio of claim 15, wherein the recorded audio is an audio sample of the first audio signal during the first time period.

* * * * *